US007737726B1

(12) United States Patent
Zhang et al.

(10) Patent No.: US 7,737,726 B1
(45) Date of Patent: Jun. 15, 2010

(54) HYBRID RESISTOR/FET-LOGIC DEMULTIPLEXER ARCHITECTURE DESIGN FOR HYBRID CMOS/NANODEVICE CIRCUITS

(75) Inventors: Tong Zhang, Troy, NY (US); Shu Li, Troy, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 27 days.

(21) Appl. No.: 12/334,186

(22) Filed: Dec. 12, 2008

Related U.S. Application Data

(60) Provisional application No. 61/035,755, filed on Mar. 12, 2008.

(51) Int. Cl.
*H01L 25/00* (2006.01)
*H03K 19/177* (2006.01)
(52) U.S. Cl. .............................. 326/41; 326/38; 326/47
(58) Field of Classification Search ........................ None
See application file for complete search history.

(56) References Cited

U.S. PATENT DOCUMENTS

| 6,256,767 | B1 * | 7/2001 | Kuekes et al. ................... 716/9 |
| 7,292,498 | B2 * | 11/2007 | Snider ................... 365/230.02 |
| 7,319,416 | B2 | 1/2008 | Robinett et al. |
| 7,350,132 | B2 | 3/2008 | Kuekes et al. |
| 2007/0291524 | A1 * | 12/2007 | Davis et al. ................... 365/49 |

OTHER PUBLICATIONS

Reed, M.A., "Molecular-Scale Electronics," *Proceedings of the IEEE*, Apr. 1999, pp. 652-658, vol. 87. No. 4.

Rueckes, T. et al., "Carbon Nanotube-Based Nonvolatile Random Access Memory for Molecular Computing," *Science*, Jul. 7, 2000, pp. 94-97, vol. 289, No. 5476.

Whitesides, G.M. et al., "Self-Assembly at All Scales," *Science*, Mar. 29, 2002, pp. 2418-2421, vol. 295, No. 5564.

Melosh, N.A. et al., "Ultrahigh-Density Nanowire Lattices and Circuits," *Science*, Apr. 4, 2003, pp. 112-115, vol. 300.

Reed, M.A., "Molecular Electronics: Back under control," *Nature Materials*, May 2004, pp. 286-287, vol. 3.

Goldstein, S.C. et al., "NanoFabrics: Spatial Computing Using Molecular Electronics," *Proc. Of International Symposium on Computer Architecture*, Jul. 2001, pp. 178-189.

Dehon, A., "Array-Based Architecture for FET-Based, Nanoscale Electronics," *IEEE Transactions on Nanotechnology*, Mar. 2003, pp. 23-32, vol. 2, No. 1.

(Continued)

*Primary Examiner*—Anh Q Tran
(74) *Attorney, Agent, or Firm*—Saliwanchilk, Lloyd & Saliwanchik

(57) ABSTRACT

A hybrid resistor/FET-logic demultiplexer (demux) is provided. According to an embodiment, hybrid nonoelectronics, which incorporate nanodevice crossbars on CMOS backplane circuits, can be implemented using the subject demux as the interface between the nanowires in the nanodevice crossbars and the microwires fabricated in the CMOS domain. Embodiments of the present invention incorporate resistor-logic and FET-logic to realize the demultiplexing function. In various embodiments, a single column of p-type FETs is used to convert the linear voltage output of a resistor-logic demux core into a nonlinear output so that the desired demultiplexing function can be much better approximated. The resistor-logic demux core design can still be optimized using constant weight codes, whereas the optimization constraint on the constant weight code construction is largely relaxed, which can result in a more area efficient demux.

12 Claims, 10 Drawing Sheets

OTHER PUBLICATIONS

Kuekes, P.J. et al., "The crossbar latch: Logic value storage, restoration, and inversion in crossbar circuits," *Journal of Applied Physics*, 2005, pp. 034301:1-034301:5, vol. 97.

Ziegler, M.M. et al., "CMOS/Nano Co-Design for Crossbar-Based Molecular Electronic Systems," *IEEE Transactions on Nanotechnology*, Dec. 2003, pp. 217-230, vol. 2, No. 4.

Kuekes, P.J. et al., "Defect-tolerant interconnect to nanoelectric circuits: internally redundant demultiplexers based on error-correcting codes," *Nanotechnology*, 2005, pp. 869-882, vol. 16.

Beckman, R. et al., "Bridging Dimensions: Demultiplexing Ultrahigh-Density Nanowire Circuits," *Science*, 2005, pp. 465-468, vol. 310.

Dehon, A., "Deterministic Addressing of Nanoscale Devices Assembled at Sublithographic Pitches," *IEEE Transactions on Nanotechnology*, Nov. 2005, pp. 681-687, vol. 4, No. 6.

Savage, J.E. et al., "Radial Addressing of Nanowires," *ACM Journal on Emerging Technologies in Computing Systems*, Apr. 2006, pp. 129-154, vol. 2, No. 2.

Kuekes, P.J. et al., "Resistor-Logic Demultiplexers for Nanoelectronics Based on Constant-Weight Codes," *Nanotechnology*, 2006, pp. 1052-1061, vol. 17.

Snider, G.S. et al., "Crossbar Demultiplexers for Nanoelectronics Based on $n$-Hot Codes," *IEEE Transactions on Nanotechnology*, Mar. 2005, pp. 249-254, vol. 4, No. 2.

Kuekes, P.J. et al., "Effect of Conductance Variability on Resistor-Logic Demultiplexers for Nanoelectronics," *IEEE Transactions on Nanotechnology*, Sep. 2006, pp. 446-454, vol. 5, No. 5.

Walls, T.J. et al., "MOSFETs below 10 nm: quantum theory," *Physica E*, 2003, pp. 23-27, vol. 19.

Frank, D.J. et al., "Device Scaling Limits of Si MOSFETs and Their Application Dependencies," *Proceedings of the IEEE*, Mar. 2001, pp. 259-288, vol. 89, No. 3.

Likharev, K.K. et al., "CMOL: Devices, Circuits, and Architectures," *Introducing Molecular Electronics*, 2005, pp. 447-477, Springer, Berlin, Germany.

* cited by examiner

HYBRID RESISTOR/FET-LOGIC DEMULTIPLEXER ARCHITECTURE DESIGN FOR HYBRID CMOS/NANODEVICE CIRCUITS

CROSS-REFERENCE TO RELATED APPLICATION

This application claims the benefit of U.S. Ser. No. 61/035,755, filed on Mar. 21, 2008, which is hereby incorporated by reference in its entirety (including all tables, figures, and other associated data).

GOVERNMENT SUPPORT

The subject invention was made with government support under a research project supported by the Interconnect Focus Center Contract No. CO50117. Accordingly, the government has certain rights in this invention.

BACKGROUND

The past few years have experienced spectacular advances in the fabrication and manipulation of new nanoscale switching devices. Although new nanoscale switching devices show significant future promise, there is a growing consensus that, at least in the near term, they cannot completely replace CMOS technology. As a result, there is a substantial demand to explore the opportunities for nanoscale CMOS and emerging non-silicon devices to enhance and complement each other to sustain the Moore's Law beyond the CMOS scaling limits. Accordingly, hybrid CMOS/nanodevice circuits are being explored. A conceptual schematic of the principle structure of a hybrid CMOS/nanodevice circuit is illustrated in FIG. 1, where an array of nanoscale wire ("nanowire") crossbars 10 sits on the top of a CMOS circuit 20. Referring to the inset of FIG. 1, the nanowire crossbars of the array 10 include a first layer of nanowires 11 arranged in a first direction and a second layer of nanowires 12 arranged in a second direction. The nanowires 11 of the first layer and the nanowires of the second layer 12 are connected by simple nanodevices 15 at each crosspoint. The crosspoint nanodevices 15 are responsible for the bulk of information processing and/or storage, while the CMOS circuit 20 performs signal restoration, testing, I/O, global interconnect, and other functions. Such a combination leverages the density and low cost advantages of nanodevices and allows the functionality, flexibility, and reliability of CMOS circuits to be used to its fullest extent.

One of the main design issues in hybrid nanoelectronic circuits is the interface between highly dense nanowires within nanodevice crossbars and photolithographically defined features of the CMOS subsystem ("microwires"). Several possible solutions have been proposed to tackle this challenge, which may be categorized based on whether the microwire-to-nanowire accessibility is realized through direct microwire-nanowire ohmic contact or a logic circuit called a microwire-to-nanowire demultiplexer (demux). The current demux design solutions have a crossbar structure consisting of one layer of parallel nanowires and one layer of parallel microwires (see e.g., FIG. 2). A demux takes the voltages of all the microwires as input to drive the voltage of only one nanowire (the selected nanowire) to a pre-specified value. Meanwhile, in order to ensure good operation reliability, the demux should keep the voltages of all the unselected nanowires well constrained in a safety window far away from that of the selected nanowire or keep all the unselected nanowires floating. In prior work on demux design, such demultiplexing function is realized by implementing a single type of device such as a resistor, a diode, or a field effect transistor (FET) at a subset of the microwire-nanowire crosspoints. Because the nonlinear nature of a diode's and FET's electrical characteristics can well match the nonlinear nature of the desired demultiplexing function, diode-logic and FET-logic demuxes can, in principle, very well approximate the ideal demultiplexing behavior. However, as pointed out in "Resistor-Logic Demultiplexers for Nanoelectronics Based on Constant-Weight Codes" by Kuekes et al. (*Nanotechnology*, vol. 17, pp. 1052-61, 2006) and "Crossbar Demultiplexers for Nanoelectronics Based on N-Hot Codes" by Snider et al. (*IEEE Trans. on Nanotech.*, vol. 4, pp. 249-54, 2005), which are herein incorporated by reference in their entirety, diode-logic and FET-logic demuxes suffer from significant difficulties of reliable fabrication using current technology. Moreover, FET-logic demuxes tend to suffer from low operational speed because of the serial chains of FETs along the signal path. In contrast, these issues may be much less serious for a resistor-logic demux. Nevertheless, due to the linear nature of a resistor's electrical characteristics, a resistor-logic demux inherently cannot well approximate the desired nonlinear demultiplexing behavior. Recent work by Kuekes et al. and Snider et al. above has applied constant weight codes, a topic in classical coding theory, to design a resistor-logic demux structure with optimal operation margin, which may relatively better approximate the demultiplexing behavior.

As illustrated in FIG. 2, a resistor-logic demux typically has a microwire-nanowire crossbar structure (101/201) with identical resistors 50 implemented at certain microwire-nanowire crosspoints. Let $N_{micro}$ and $N_{nano}$ denote the number of microwires and nanowires within the resistor-logic demux crossbar, respectively. All the resistors at the crosspoints form $N_{nano}$ distinct resistor-based linear voltage dividers that share the same $N_{micro}$ input voltages, and each voltage divider drives one individual nanowire. If a '1' and a '0' are used to represent the presence and absence, respectively, of a resistor at each crosspoint, each nanowire (and hence each voltage divider) can be represented by an $N_{micro}$-bit nanowire characteristic vector. Accordingly, the entire demux can be represented by an $N_{nano} \times N_{micro}$ demux characteristic matrix in which each row is one nanowire characteristic vector, as illustrated in FIG. 2. For example, for the resistor-logic demux of FIG. 2, the top row is represented by the nanowire characteristic vector [1 1 0 0] where a resistor 50 is present at the first two crosspoints in the row and a resistor is absent at the second two crosspoints in the row. The next row is represented by the nanowire characteristic vector [1 0 1 0] where a resistor 50 is present at the first and third crosspoints and a resistor is absent at the second and fourth crosspoints. Similarly, the third row is represented by the nanowire characteristic vector [1 0 0 1] where a resistor 50 is present at the first and fourth crosspoints and a resistor is absent at the second and third crosspoints.

As described above, a demux should drive the voltage of only one nanowire (i.e., the selected nanowire) to a pre-specified value and keep the voltages of all the unselected nanowires well constrained in a safety window far away from that of the selected nanowire or keep all the unselected nanowires floating. Let $V_{sel}$ denote the desired output voltage of the selected nanowire. It can be assumed that the input voltage on each microwire can be either $V_{sel}$ or $V_0$, and an $N_{micro}$-bit input vector can be defined in which '1' and '0' represent that the voltage of the corresponding microwire is to be $V_{sel}$ and $V_0$, respectively. Hence, the input vector of the microwires is set equal to the characteristic vector of the nanowire to be selected. Given one binary vector s, let wt(s) denote its Hamming weight (i.e., the number of 1's in the binary vector s). Given the input vector h, the output voltage of the nanowire with the characteristic vector v is $$\frac{wt(h \text{ AND } v)}{wt(v)} \cdot (V_{set} - V_0) + V_0. \quad (1)$$

Let $V_{wire}^m$ denote the minimum value of the voltage differences between the selected nanowire and any unselected nanowires. In general, the objective of resistor-logic demux design is to maximize $V_{wire}^m/V_{sel}$ in order to improve the operational reliability. However, in the context of crossbar nanoelectronic circuits that are of most practical interest, the objective of resistor-logic demux design is beyond mere maximization of $V_{wire}^m/V_{sel}$. For crossbar nanoelectronic circuits, a pair of demuxes is used to drive both the rows and the columns of nanowires. The crosspoint of the selected row nanowire (see reference 11 of FIG. 1) and the selected column nanowire (see reference 12 of FIG. 1) is where the selected nanodevice (see reference 15 of FIG. 1) under operation lies. The magnitude of the voltage drop across the selected nanodevice under operation, denoted as $\Delta V_{sel}$, typically should be greater than that of any other unselected nanodevices. Let $\Delta v_{unsel}$ denote the set of the magnitudes of voltage drops across any unselected nanodevices. In this context, the main objective of demux design is to maximize $v_m$ (i.e., the normalized margin of the voltages across the selected and unselected nanodevices), which is defined as $$v_m = 1 - \frac{\max(\Delta v_{unsel})}{\Delta V_{sel}}. \quad (2)$$

Mere maximization of $V_{wire}^m/V_{sel}$ for the individual row or column resistor-logic demux does not necessarily maximize the normalized margin $v_m$. Since how to design the demux (i.e., how to construct the demux characteristic matrix) to only maximize $V_{wire}^m/V_{sel}$ is already nontrivial, the design of optimum row and column demuxes for nanodevice crossbars certainly becomes more challenging.

It has been well demonstrated by Kuekes et al. and Snider et al. above that constant weight codes can be readily leveraged to tackle this challenge. Since only binary constant weight code is used in this context, the term constant weight code within this disclosure refers to binary constant weight code. The constant weight code is a code where all codewords have the same Hamming weight. A constant weight code is denoted as (n, M, $d_{min}$, $d_{max}$, w), where n is the length of each codeword, M is the number of codewords, $d_{min}$ and $d_{max}$ are the minimum and maximum Hamming distance between any two codewords, and w is the weight of the codewords. To design a resistor-logic demux with $N_{micro}$ microwires and $N_{nano}$ nanowires, a constant weight code is constructed as ($N_{micro}$, $N_{nano}$, $d_{min}$, $d_{max}$, w) and each $N_{micro}$-bit codeword is assigned as one nanowire characteristic vector. For any two codewords s and t in a constant weight code, wt(s AND t)=w−dist(s,t)/2, where dist(s,t) denotes the Hamming distance between s and t. Therefore, equation (1) can be rewritten as $$\frac{w - dist(h,v)/2}{w} \cdot (V_{sel} - V_0) + V_0 \quad (3)$$

With the assumption that the row and column demuxes are identical (i.e., they use the same constant weight code), it has been shown by Kuekes et al. above that the normalized voltage margin $v_m$ defined in equation (2) is equal to $2d_{min}/(2d_{max}+d_{min})$. Therefore, in order to maximize the normalized margin $v_m$, the ratio $d_{min}/d_{max}$ should be maximized. In addition, it is clear from equation (3) that the maximization of $V_{wire}^m/V_{sel}$ for each demux only requires to maximize $d_{min}$. Meanwhile, it is desirable for the row and column demuxes to use as few numbers of microwires as possible in order to reduce the area overhead. Therefore, for nanodevice crossbar circuits with $N_{nano}$ nanowires along each direction, the essential demux design challenge is how to construct a constant weight code ($N_{micro}$, $N_{nano}$, $d_{min}$, $d_{max}$, w) that has a minimum value of $N_{micro}$ and maximum value of $d_{min}/d_{max}$. However, minimization of $N_{micro}$ and maximization of $d_{min}/d_{max}$ are typically conflicting to each other. That is, in order to increase the ratio $d_{min}/d_{max}$, a constant weight code with longer codeword length (or the value of $N_{micro}$) may have to be used. As shown in "Resistor-Logic Demultiplexers for Nanoelectronics Based on Constant-Weight Codes" by Kuekes et al., a constant weight code (8, 70, 2, 8, 4) can drive 70 nanowires using 8 microwires and has the ratio $d_{min}/d_{max}=\frac{1}{4}$. In order to increase the ratio $d_{min}/d_{max}$ from ¼ to ⅔, a constant weight code (19, 70, 8, 12, 9) that requires 19 input microwires must be used.

Thus, there exists a need in the art for an improved demultiplexer design and system.

BRIEF SUMMARY

Embodiments of the present invention relate to an interconnection interface for hybrid CMOS/nanodevice electronic systems. According to an embodiment, a hybrid resistor/FET-logic demux design solution is provided that can much better approach the desired demultiplexing behavior compared with conventional resistor-logic demux, while maintaining the inherent advantages of resistor-logic demux in terms of manufacturability and operational speed.

In an embodiment, a single column of p-type FETs (pFETs) is used to convert the linear voltage output of a resistor-logic demux core to be nonlinear so that the desired demultiplexing function can be much better approximated. The resistor-logic demux core design can still be optimized using constant weight codes, whereas the optimization constraint on the constant weight code construction is largely relaxed, which will tend to result in a more area efficient demux.

Furthermore, the geometric regularity of the single column pFETs makes the fabrication of pFETs relatively simple and hence may not greatly sacrifice the manufacturability advantage gained by using resistors in the demux core. According to an embodiment of the present invention, only a selected nanowire is driven to the desired voltage while all the other unselected nanowires remain floating. This obviates the concern of the operational voltage margin for the nanodevice operation within the nanodevice crossbar. In an implementation of the subject demux, the number of microwires can be reduced and the construction of constant weight codes can be facilitated by focusing on the maximization of $d_{min}$ instead of $d_{min}/d_{max}$. Advantageously, through the use of the single column of pFETs, a nanodevice crossbar can be much less sensitive to the operational variability of the resistor-logic core incurred by environmental and process variations. Meanwhile, since only one pFET is implemented along each nanowire, the speed degradation can be much less compared with that of a FET-logic demux. In addition, since the resistor-logic demux core no longer directly drives the nanowires within the nanodevice crossbar, the overall system energy consumption will be accordingly reduced. That is, according to an embodiment, only one voltage divider needs to drive the load from the nanodevice crossbar. Accordingly, embodiments of the present invention provide an equivalent logic function to FET-based demux design solutions while maintaining the inherent advantages of resistor-logic demux manufacturability and speed.

BRIEF DESCRIPTION OF THE DRAWINGS

FIG. 4A shows a longitudinal cross-section through a microwire and FIG. 4B shows a longitudinal cross-section through a nanowire.

FIG. 8A shows a plot where d=0; FIG. 8B shows a plot where d=2; FIG. 8C shows a plot where d=4; FIG. 8D shows a plot where d=6; FIG. 8E shows a plot where d=8; and FIG. 8F shows a plot where d=10.

DETAILED DISCLOSURE

Various embodiments of the present invention provide a demultiplexer for hybrid CMOS/nanodevice electronic systems. An implementation of the present invention provides design methods for an interconnection interface, improving upon a resistor-logic demux. One challenge of resistor-logic demux design is due to the conflict between the linear nature of its operation and the desired nonlinear nature of an ideal demux. According to embodiments of the present invention, the linear vs. nonlinear conflict can be avoided by introducing a column of pFETs between the resistor-logic demux and the nanodevice crossbar, as illustrated in FIG. 3.

Figure 1:
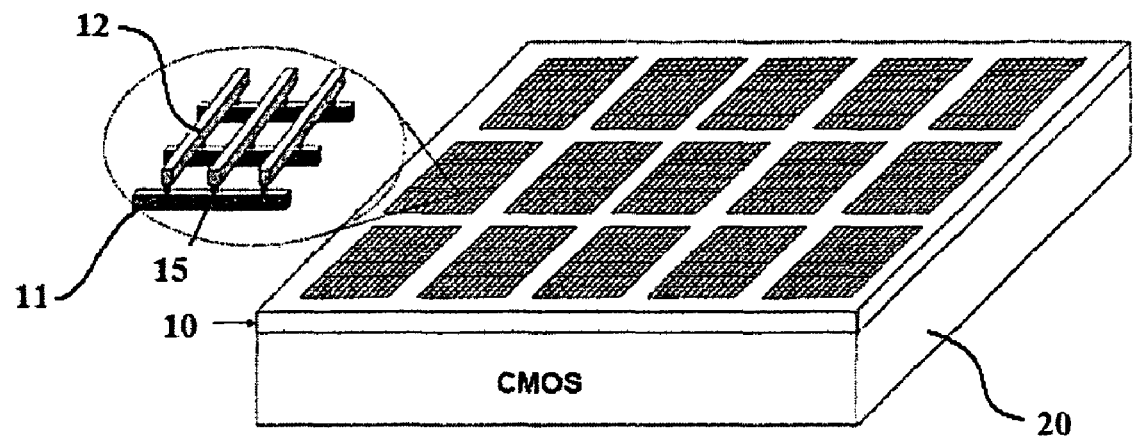
FIG. 1 shows a perspective view of the principal structure of hybrid CMOS/nanodevice circuits.
Figure 2:
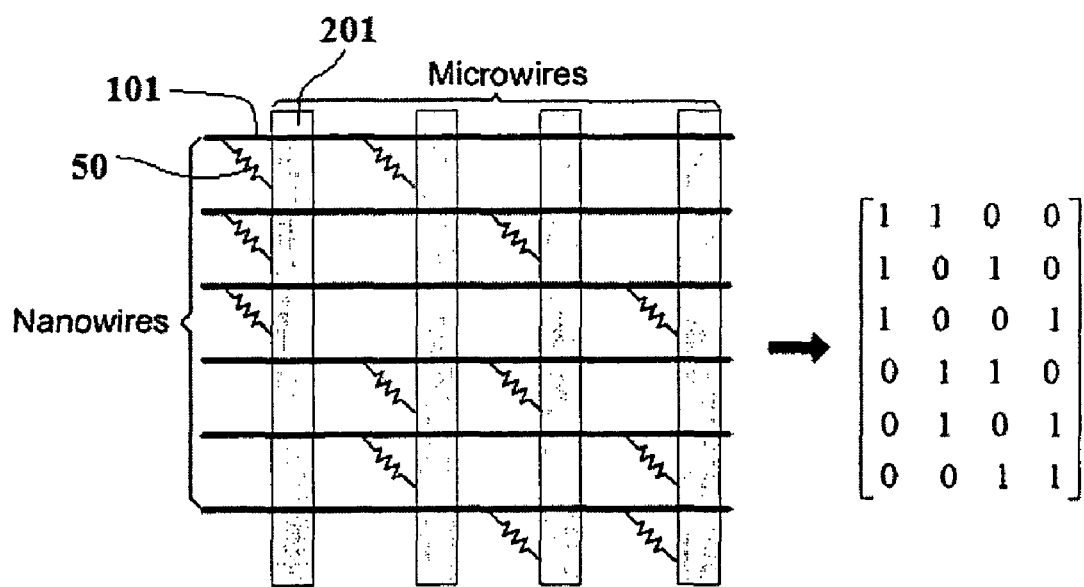
FIG. 2 shows a schematic of a typical crossbar structure of a resistor-logic demux and its characteristic matrix.
Figure 3:
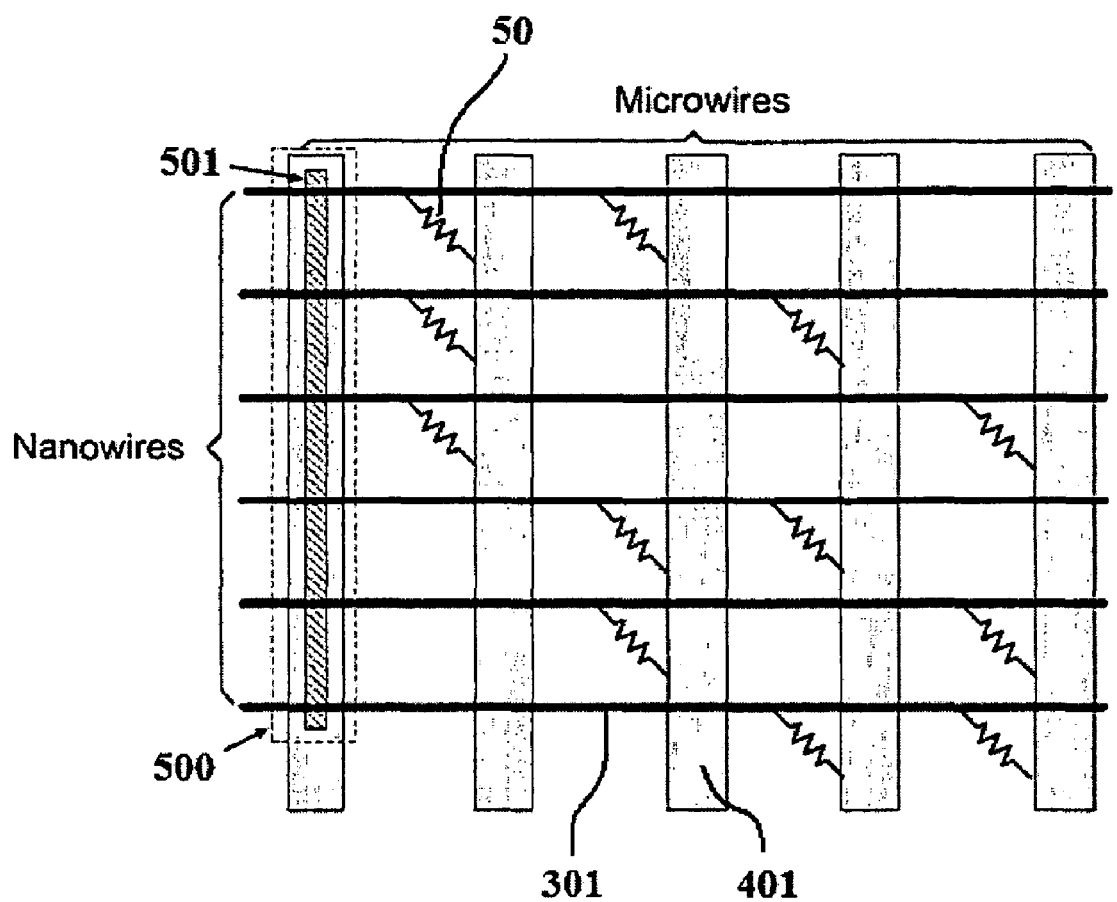
FIG. 3 shows a schematic of a structure of a hybrid resistor/FET-logic demux in accordance with an embodiment of the present invention.

Referring to FIG. 3, a hybrid resistor/FET-logic demux according to an embodiment of the present invention can have a microwire-nanowire crossbar structure (301/401) with resistors 50 implemented at certain microwire-nanowire crosspoints and a pFET array 500 connected to the nanowires.

As previously described, $N_{micro}$ is the number of microwires within the resistor-logic portion crossbar and $N_{nano}$ is the number of nanowires within the resistor-logic portion crossbar, such that the resistors at the crosspoints form $N_{nano}$ distinct resistor-based linear voltage dividers that share the same $N_{micro}$ input voltages, and each voltage divider drives one individual nanowire. Where a '1' and a '0' are used to represent the presence and absence, respectively, of a resistor at each crosspoint, each nanowire can be represented by an $N_{micro}$-bit nanowire characteristic vector, v.

For example, for the resistor-logic portion of the demux illustrated in FIG. 3, the top row can be represented by the nanowire characteristic vector [1 1 0 0] where a resistor 50 is present at the first two crosspoints in the row and a resistor is absent at the second two crosspoints in the row. The next row is represented by the nanowire characteristic vector [1 0 1 0] where a resistor 50 is present at the first and third crosspoints and a resistor is absent at the second and fourth crosspoints. Similarly, the third row is represented by the nanowire characteristic vector [1 0 0 1] where a resistor 50 is present at the first and fourth crosspoints and a resistor is absent at the second and third crosspoints; the fourth row is represented by the nanowire characteristic vector [0 1 1 0] where a resistor 50 is present at the second and third crosspoints and a resistor is absent at the first and fourth crosspoints; the fifth row is represented by the nanowire characteristic vector [0 1 0 1] where a resistor 50 is present at the second and fourth crosspoints and a resistor is absent at the first and third crosspoints; and the sixth row is represented by the nanowire characteristic vector [0 0 1 1] where a resistor 50 is present at the third and fourth crosspoints and a resistor is absent at the first and second crosspoints. It should be noted that the specific order of the characteristic vectors is not important as long as each nanowire has an addressable characteristic vector.

In addition, a dielectric layer 501 can be disposed along a longitudinal direction of a microwire, providing a region for the pFET array 500.

A pFET can be formed along each nanowire through appropriate doping and fabrication of dielectric layer 501. The feasibility of fabricating a transistor on a nanowire has been experimentally demonstrated in "Bridging Dimensions: Demultiplexing Ultrahigh-Density nanowire Circuits" by Beckman et al. (*Science*, vol. 310, pp. 465-68, 2005), which reports a design of a FET-logic demux and is hereby incorporated by reference in its entirety.

Figure 4A:
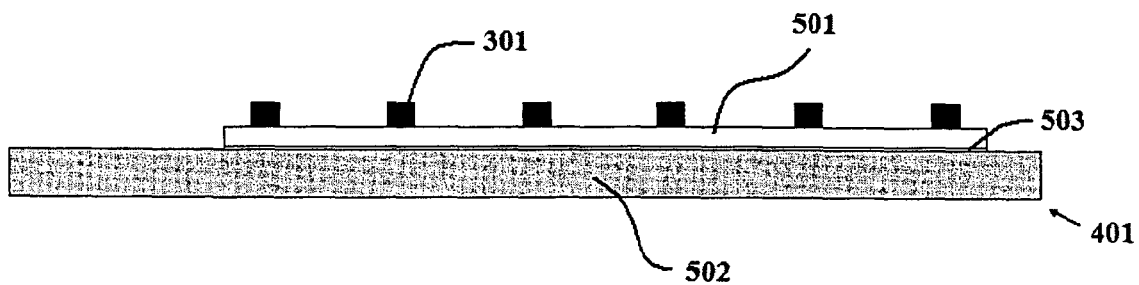
FIGS. 4A and 4B show cross-sectional views of the structure of a hybrid resistor/FET-logic demux according to an embodiment of the present invention.
Figure 4B:
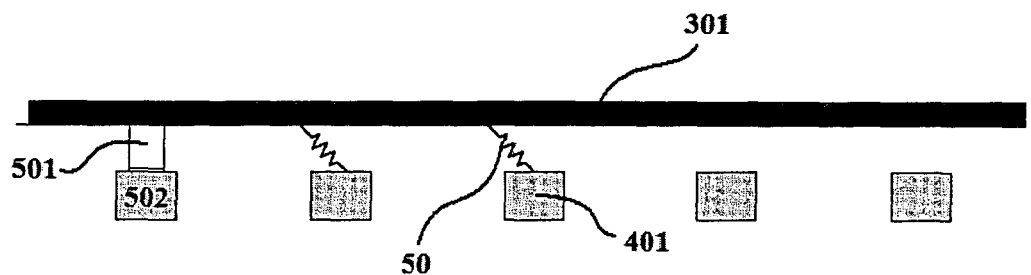

FIGS. 4A and 4B show cross-sectional views of one embodiment of the subject demux utilizing a similar transistor fabrication as described by Beckman et al. FIG. 4B shows a cross-section along the longitudinal axis of the top nanowire of FIG. 3. Referring to FIGS. 4A and 4B, the dielectric layer 501 can be disposed on a portion of one of the microwires 401 that will function as a gate 502 (spatially reversed) "on" each nanowire 301. In one embodiment, the dielectric layer 501 can be a low-k dielectric, and a high-k dielectric layer 503 can be provided with the low-k dielectric layer 501. For example, the high-k dielectric layer 503 can be disposed between the low-k dielectric and the microwire 401 providing the gate 502. However, embodiments are not limited thereto. Accordingly, by forming a dielectric layer 501 on a predetermined microwire 401 that functions as a gate electrode 502, a same gate voltage can easily be applied to all the pFETs through a simple fabrication process.

The resultant overall demux can be referred to as a hybrid resistor/FET-logic demux. The column of pFETs converts the linear output voltage of the resistor-logic demux core into nonlinear output voltage that can well match the expected nonlinear behavior of an ideal demux. According to an implementation, the pFET associated with the selected nanowire is turned on and all the other pFETs are turned off during nanowire selection.

When $V_{sel}$ denotes the desired output voltage of the selected nanowire, it can be assumed that the input voltage on each microwire can be either $V_{sel}$ or $V_0$, and an $N_{micro}$-bit input vector can be defined in which a '1' represents that the voltage of the corresponding microwire is to be $V_{sel}$ and '0' represents that the voltage of the corresponding microwire is to be $V_0$. Then, the input vector of the microwires can be set equal to the characteristic vector of the nanowire to be selected. In one implementation, $V_{sel}$ can be set as Vdd. With the addition of a pFET for each nanowire, the nanowires can be provided with larger operational margins to indicate selection with improved efficiency.

According to equation (1), within the resistor-logic core, the selected nanowire has a voltage of $V_{sel}$ and the voltages of all the other nanowires fall into the range $$\left[\frac{w-d_{max}/2}{w} \cdot (V_{sel}-V_0) + V_0, \frac{w-d_{min}/2}{w} \cdot (V_{sel}-V_0) + V_0\right].$$

Therefore, the minimal voltage difference between the selected nanowire and any other unselected nanowire, which is denoted as $V_{wire}^m$ as defined earlier, equals to $$\frac{d_{min}}{2w}(V_{sel}-V_0).$$

This minimal voltage difference is then taken into consideration in the biasing scheme for the pFETs to enable only the pFET for the selected nanowire to be turned on.

According to an embodiment, all the pFETs can share the same gate voltage denoted as $V_g$. For the following equations, it can be assumed that all the pFETs have the same threshold voltage $V_{tp}$. Accordingly, in order to only turn on the pFET associated with the selected nanowire, the gate voltage $V_g$ and the threshold voltage $V_{tp}$ of the pFETs must satisfy $$\begin{cases} V_g - V_{sel} < V_{tp} \\ V_g - (V_{sel} - V_{wire}^m) > V_{tp} \end{cases} \Rightarrow (V_{sel} - V_{wire}^m) < (V_g - V_{tp}) < V_{sel}. \quad (4)$$

It should be noted that for a pFET, $V_{tp}<0$. To balance the operational margin, $V_g-V_{tp}$ can be set to $V_{sel}-V_{wire}^m/2$. To maximize the operational margin and hence the demux reliability, it is desirable to maximize the minimal voltage difference $V_{wire}^m$ (or equivalently $d_{min}$). According to embodiments, this hybrid resistor/FET-logic demux an have the same function as the pure FET-based demux solutions proposed in "Bridging dimensions: demultiplexing ultrahigh-density nanowire circuits," by Beckman et al. (*Science*, vol. 310, pp. 465-68, 2005), "Deterministic addressing of nanoscale devices assembled at sublithographic pitches," by A. DeHon (*IEEE Trans. Nanotech.*, vol. 4, pp. 681-87, 2005), and "Radial addressing of nanowires," by Savage et al. (*ACM J. Emerg. Tech. Comp. Sys.*, vol. 2, pp. 129-154). That is, according to certain embodiments, the pFET array allows for demultiplexing using a few microwire to select any one nanowire from highly dense nanowires at given time. Consequently, the selection of each of the nanowires can be realized using a fewer number of microwires.

Due to the regularity of the pFETs array, it is reasonable to expect that the fabrication of the pFETs can be relatively easy. For implementation of embodiments of the subject nanodevice crossbar circuits, the desired voltage drop across the selected nanodevice can be easily realized by applying the appropriate gate voltages and input microwire voltages to both row and column demuxes. It is clear that, in order to improve the demux operational reliability, only the value of $d_{min}$ of the constant weight codes needs to be increased, which can be much more efficient (in terms of the required microwire numbers) compared with increasing $d_{min}/d_{max}$.

Compared with the conventional resistor-logic demux design, embodiments of the subject hybrid resistor/FET-logic demux design can have one or more of the following advantages, including, but not limited to: (i) Only the selected nanowire will be driven to the desired voltage while all other unselected nanowires will keep floating. This obviates the concern of the operational voltage margin for the nanodevice operation within the nanodevice crossbar. (ii) The demux design objective becomes the maximization of $d_{min}$ instead of $d_{min}/d_{max}$, which will facilitate the construction of constant weight codes and reduce the number of required microwires. (iii) The nanodevice crossbar can be much less sensitive to the operational variability of the resistor-logic core incurred by environmental and process variations. (iv) The power consumption may be reduced since only one voltage divider needs to drive the load from the nanodevice crossbar. (v) The subject demux can have equivalent logic function as the previously proposed FET-based demux design solutions, but maintains the inherent advantages of resistor-logic demux in terms of manufacturability and speed.

The equations above were based on an assumption that all the resistors and pFETs in the demux are identical (i.e., all the resistors have the same resistance and all the pFETs have the same threshold voltage). However, such an ideal assumption does not remain valid in practice due to the inevitable fabrication process variations at nanoscale. The following section investigates the effects of process variations on the reliability of the above proposed hybrid demux design.

Here, the demux reliability is measured using a metric called functioning probability $P_{demux}$ defined as $$P_{demux} = \prod_{i=1}^{N_{nano}} P_{nano}^{(i)}, \quad (5)$$

where $N_{nano}$ is the total number of nanowires (i.e., the number of codewords of the constant weight code being used), and $P_{mono}^{(i)}$ is the nanowire functioning probability that the i-th nanowire can be correctly selected (i.e., given the corresponding input vector, only the pFET associated with this nanowire is turned on and all the other pFETs are off). In the following, the effects of resistor and pFET variability are separately addressed and then the two factors are jointly considered.

Effect of Resistor Conductance Variability

It is assumed that, due to the resistor fabrication process variations, the conductance of all the resistors are independent identical normal random variables. It is preferable to use conductance rather than resistance in modeling the resistor fabrication process variations. This is mainly because, for the fabrication of resistors at the crosspoints, a short defect (i.e., the resistance of a resistor is significantly less than that of others) is much more disruptive than an open defect (i.e., the resistance of a resistor is significantly larger than that of others), hence the fabrication process should ensure that the probability of short defects is extremely low at the cost of higher probability of open defects. This may lead to a highly asymmetric distribution of the resistance, which may result in a more symmetric distribution of the conductance. Hence it is possible to assume that the conductance rather than resistance have the symmetric normal distribution.

Each resistor-based voltage divider in the hybrid demux determines the source voltage of the associated pFET. Since only the resistor variability is being considered at this point, all the pFETs have the same threshold voltage $V_{tp}$. Let $V_{gs}^{(i)}$ denote the voltage difference between the gate and source of the pFET along the i-th nanowire, and a voltage gap parameter $V_{gap}^{(i)}$ is defined as $V_{gap}^{(i)} = V_{gs}^{(i)} - V_{tp}$ for each nanowire. Clearly, the i-th nanowire is selected (i.e., the associated pFET is turned on) or unselected (i.e., the associated pFET is turned off) when $V_{gap}^{(i)}$ is negative or positive. Due to the randomness of the conductance of all the resistors, the voltage gap of each nanowire is a random variable (and will be shown later further approximated as a normal random variable). For one nanowire with the characteristic vector of $v^{(i)}$, its functioning probability $P_{nano}^{(i)}$ solely depends on the statistical characteristics of voltage gaps of all the nanowires when the input vector equals to $v^{(i)}$. Let $P(V_{gap}^{(i)} < 0)$ and $P(V_{gap}^{(i)} > 0)$ represent the probabilities that $V_{gap}^{(i)}$ is negative and positive, respectively, then equation (5) becomes $$P_{nano}^{(i)} = P(V_{gap}^{(i)} < 0) \cdot \prod_{j \neq i} P(V_{gap}^{(j)} > 0). \tag{6}$$

Clearly, in order to calculate the nanowire functioning probability, the probability density function of the voltage gap for each nanowire is needed. Let d denote the Hamming distance between the input vector and the characteristic vector of one nanowire, the output of the voltage divider associated with this nanowire can be expressed as $$\frac{\sum_{j=1}^{d/2} c_j \cdot V_0 + \sum_{j=d/2+1}^{w} c_j \cdot V_{sel}}{\sum_{j=1}^{w} c_j} \tag{7}$$

where $V_{sel}$ and $V_0$ are the two voltages on the mirowires corresponding to 1 and 0 in the input vector, and $c_j$ is the conductance of each resistor. Therefore, by denoting the gate voltage of the pFET as $V_g$, the corresponding voltage gap can be written as $$V_{gap} = V_g - \frac{\sum_{j=1}^{d/2} c_j \cdot V_0 + \sum_{j=d/2+1}^{w} c_j \cdot V_{sel}}{\sum_{j=1}^{w} c_j} - V_{tp}. \tag{8}$$

Since $V_g$, $V_{tp}$, $V_{sel}$, and $V_0$ are constant, the probability density function of $V_{gap}$ solely depends on the conductances $c_j$ of the resistors. Notice that for d=0 (i.e., the selected nanowire itself), $V_{gap}$ reduces to a negative constant $V_g - V_{sel} - V_{tp}$. Hence the term $P(V_{gap}^{(i)} < 0)$ in equation (6) is 1, and equation (6) can reduce to $$P_{nano}^{(i)} = \prod_{j \neq i} P(V_{gap}^{(j)} > 0). \tag{9}$$

Since it can be assumed that all the conductances are independent identical normal random variables, the voltage gap $V_{gap}$ of the nanowires that have the same Hamming distance with the input vector will have the same probability density function. However, because the probability density function involves the ratio between normal random variables, as shown in equation (8), it can be very difficult, if not impossible, to obtain a concise closed form expression of the probability density function of $V_{gap}$. Based on extensive numerical simulations, the probability density function of $V_{gap}$ can be approximated as a normal distribution. This is illustrated in the following example.

Example

Figure 5:
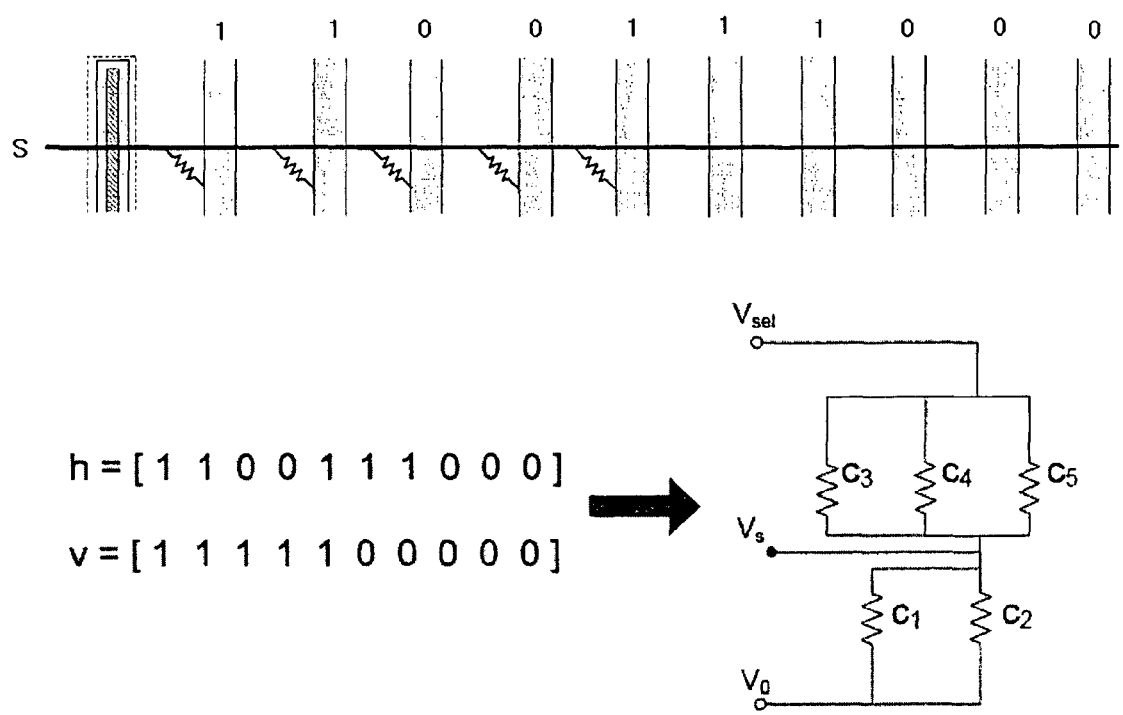
FIG. 5 shows a schematic representation for an equivalent circuit according to an illustrative example for an embodiment of the present invention.

Referring to FIG. 5, an example nanowire is shown having the characteristic vector v of [1, 1, 1, 1, 1, 0, 0, 0, 0, 0] (also referred to as a codeword). Assuming the input vector h is [1, 1, 0, 0, 1, 1, 1, 0, 0, 0] (also shown as applied to responsive microwires), the Hamming distance d=4 and the voltage divider has the structure as shown in the Figure. For the voltage divider, the five resistors are applied at one end with the voltage from their respective microwires ($V_{sel}$ for a "1" and $V_0$ for a "0") and the output voltage $V_s$ is read from the nanowire.

Figure 6:
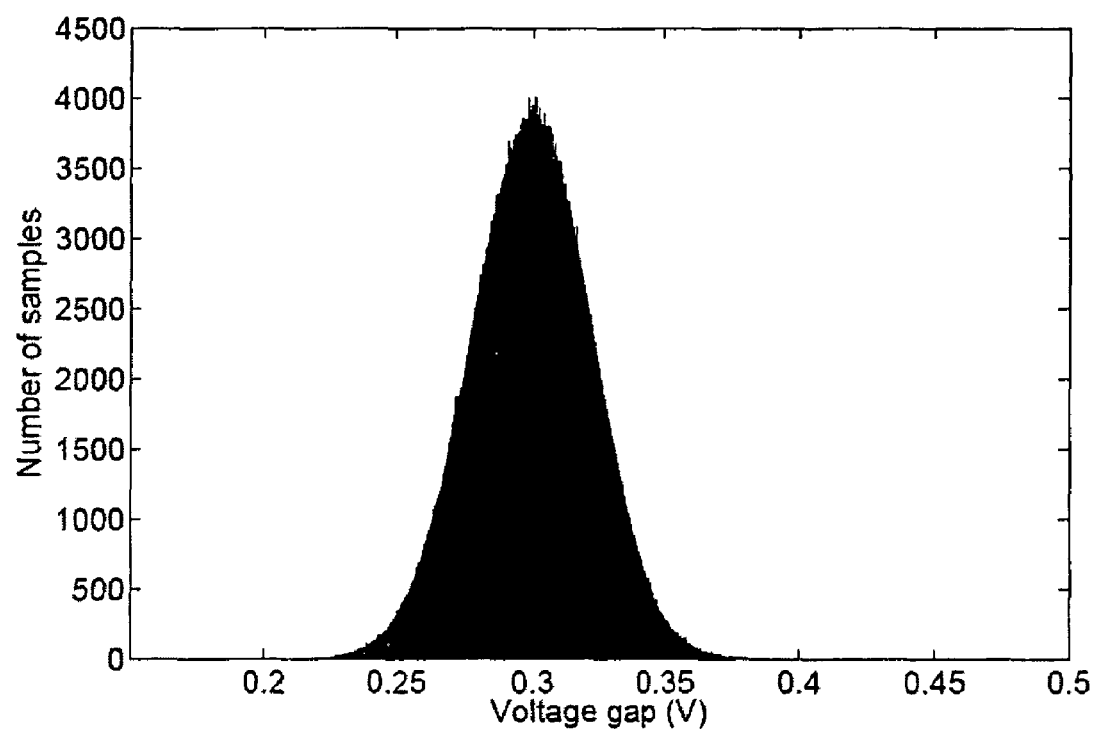
FIG. 6 shows a histogram plot of voltage gap for $10^6$ samples according to the illustrative example for an embodiment of the present invention.

Simulations were performed to capture the distribution of voltage gap with the following setup. The distribution of resistor conductance is normalized as $N(1, \sigma_c)$. Since the conductance cannot be negative, the distribution is truncated into the range $[0, \infty)$. $V_{sel}$ and $V_0$ are normalized as 1 and 0, respectively, and the pFET threshold voltage $V_{tp}$ is set as $-0.1$. The gate voltage of the pFET is set as $V_g = V_{sel} - V_{wire}^m/2 + V_{tp}$, where $$V_{wire}^m = \frac{d_{min}}{2w}(V_{sel} - V_0)$$

is the minimal voltage difference between a selected nanowire and the other unselected nanowires. By increasing $\sigma_c$ from 0.06 to 0.16 with a step of 0.02, $10^6$ sets of conductance values are randomly generated and the corresponding $10^6$ samples of $V_{gap}$ are calculated for each $\sigma_c$. FIG. 6 shows the histogram of the voltage gap when $\sigma_c = 0.1$, which turns out to be very close to a normal distribution. Based on these $10^6$ samples, the mean $\mu_{gap}$ and standard deviation $\sigma_{gap}$ are also calculated. The solid line following the curve of the distribution in FIG. 6 corresponds to the probability density function of $N(\mu_{gap}, \sigma_{gap})$. The same conclusion can be drawn from the simulation results with the other $\sigma_c$ setups. Therefore, the voltage gap $V_{gap}$ can generally be approximated to be a random variable with a normal distribution.

Therefore, to calculate the functioning probability $P_{nano}^{(i)}$ of each nanowire based on equation (9), the voltage gap mean $\mu_{gap}$ and standard deviation $\sigma_{gap}$ for all the nanowires except the one being selected need to be obtained. As pointed above, the voltage gap distribution of each nanowire solely depends on the Hamming distance between the input vector and the characteristic vector of this nanowire. For the i-th nanowire with characteristic vector $v^{(i)}$, a nanowire Hamming distance profile can be defined as $\{(d_1,n_1),(d_2,n_2),\Lambda,(d_{s_i},n_{s_i})\}$, which means there are $n_j$ nanowires whose characteristic vectors have the same Hamming distance $d_j$ with $v^{(i)}$. Correspondingly, there are $s_i$ different voltage gap normal distributions $N(\mu_{gap}{}^j, \sigma_{gap}{}^j)$ for $1 \leq j \leq s_i$. A function $Q(x)$ is defined as $$Q(x) = \frac{1}{\sqrt{2\pi}} \int_x^\infty e^{-\frac{y^2}{2}} dy \qquad (10)$$

Hence, for the calculation of the functioning probability $P_{nano}{}^{(i)}$, equation (9) can be rewritten as $$P_{nano}^{(i)} = \prod_{j \neq i}^{s_i} (Q(-\mu_{gap}^j / \sigma_{gap}^j))^{n_j}. \qquad (11)$$

After obtaining the functioning probabilities of all the nanowires, equation (5) can be used to calculate the overall functioning probability of the entire demux. Accordingly, the procedure to calculate the demux functioning probability $P_{demux}$ can be summarized as follows.

Procedure Calculation of Demux Functioning Probability $P_{demux}$

Input: Constant weight code parameters, resistor conductance distribution $N(\mu_c, \sigma_c)$, and the values of $V_{sel}, V_0, V_g$, and $V_{tp}$.

for i=1 to $N_{nano}$ do
   Identify the nanowire Hamming distance profile $\{(d_1,n_1), (d_2,n_2), \ldots, (d_{s_i},n_{s_i})\}$.
   for j=1 to $s_i$ do
      Obtain the mean $\mu_{gap}{}^j$ and standard deviation $\sigma_{gap}{}^j$ through computer simulations.
   end
   Calculate the nanowire functioning probability $P_{nano}{}^{(i)} = \prod_{j=1}^{s_i} (Q(-\mu_{gap}^j / \sigma_{gap}^j))^{n_j}$.
end Calculate the demux functioning probability $P_{demux} = \prod_{i=1}^{N_{nano}} P_{nano}{}^{(i)}$.

Figure 7:
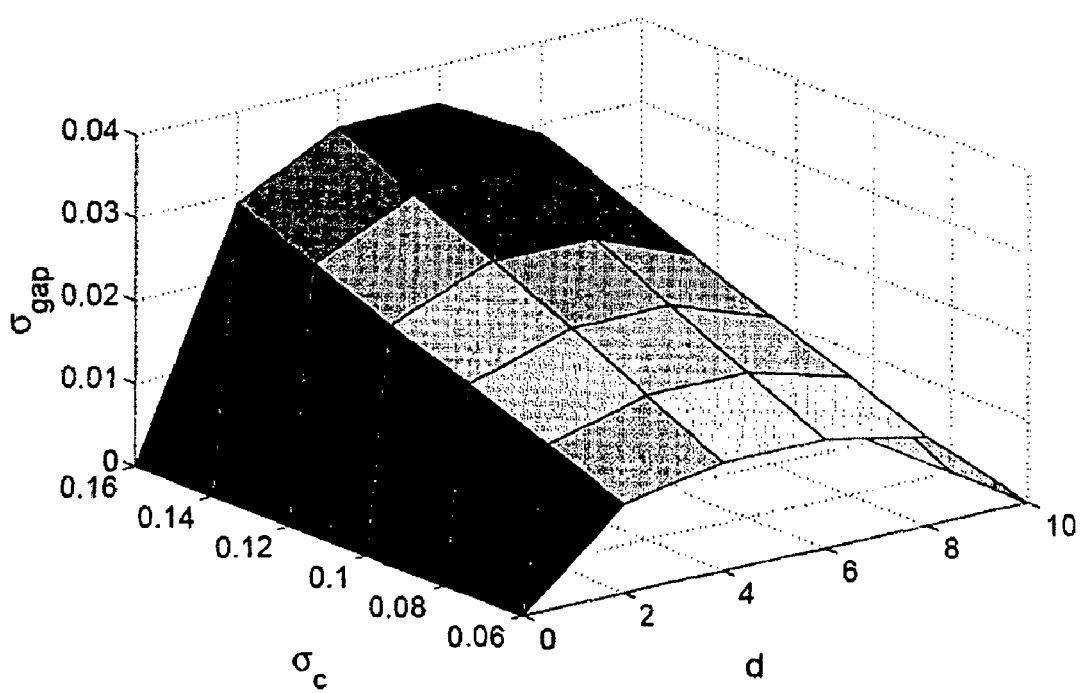
FIG. 7 shows a plot of the effect of Hamming distance d and resistor conductance standard deviation $\sigma_c$ on voltage gap standard deviation $\sigma_{gap}$.

In the following, an example is presented to illustrate the above procedure and demonstrate the impact of conductance standard deviation on the demux functioning probability. A constant weight code of (10, 252, 2, 10, 5) is used as a test vehicle, which has the property that all the nanowires have the same Hamming distance profile $\{(2, 25), (4, 100), (6, 100), (8, 25), (10, 1)\}$ (note back that 10 is the length of each codeword, 252 is the number of codewords, 2 is the minimum Hamming distance between any two codewords, 10 is the maximum Hamming distance between any two codewords, and 5 is the weight of the codewords). Hence, only the corresponding five pairs of $(\mu_{gap}{}^j, \sigma_{gap}{}^j)$ for $1 \leq j \leq 5$ need to be obtained. The resistor conductance distribution is $N(1, \sigma_c)$ and 6 different values of $\sigma_c$ are considered, including 0.06, 0.08, 0.10, 0.12, 0.14, and 0.16. For each $\sigma_c$, 100000 simulation runs are carried out to obtain each pair of $\mu_{gap}{}^j$ and $\sigma_{gap}{}^j$ for $1 \leq j \leq 5$. $V_{sel}, V_0$, and $V_{tp}$ are set as 1, 0, and −0.1, respectively. The mean of voltage gap is directly calculated from equation (8), where all the $c_j$'s are substituted with the mean value of the conductance (i.e., 1). Hence, $\mu_{gap}{}^1 = 0.1, \mu_{gap}{}^2 = 0.3, \mu_{gap}{}^3 = 0.5, \mu_{gap}{}^4 = 0.7$, and $\mu_{gap}{}^5 = 0.9$. The values of $\sigma_{gap}{}^j$ are obtained through computer simulations for different d and $\sigma_c$. The results are listed in Table 1 and further illustrated in FIG. 7.

TABLE 1

The simulated standard deviation of voltage gap $\sigma_{gap}$

| | d = 2 | d = 4 | d = 6 | d = 8 | d = 10 |
|---|---|---|---|---|---|
| $\sigma_c$ = 0.06 | 0.0107 | 0.0131 | 0.0132 | 0.0108 | 0.0000 |
| $\sigma_c$ = 0.08 | 0.0143 | 0.0175 | 0.0176 | 0.0144 | 0.0000 |
| $\sigma_c$ = 0.10 | 0.0180 | 0.0219 | 0.0220 | 0.0179 | 0.0000 |
| $\sigma_c$ = 0.12 | 0.0215 | 0.0265 | 0.0264 | 0.0215 | 0.0000 |
| $\sigma_c$ = 0.14 | 0.0253 | 0.0309 | 0.0308 | 0.0252 | 0.0000 |
| $\sigma_c$ = 0.16 | 0.0289 | 0.0353 | 0.0354 | 0.0289 | 0.0000 |

Next, all the $Q(-\mu_{gap}{}^j / \sigma_{gap}{}^j)$ for $1 \leq j \leq 5$ are calculated, and the nanowire functioning probability $P_{nano}{}^{(i)}$ is determined based on equation (11). Furthermore, for verification, for each $\sigma_c$, 100000 simulation runs were carried out to directly obtain the estimations of all the $P(V_{gap}{}^{(i)} < 0)$ and then the nanowire functioning probability was calculated using equation (11) and represented as $\tilde{P}_{nano}{}^{(i)}$. The results are shown in Table 2.

TABLE 2

Nanowire functioning probability $P_{nano}{}^{(i)}$

| $\sigma_c$ | 0.06 | 0.08 | 0.10 | 0.12 | 0.14 | 0.16 |
|---|---|---|---|---|---|---|
| $Q(-\mu_{gap}{}^1/\sigma_{gap}{}^1)$ | 1 | 1 | 1 − 1.4 × 10⁻⁸ | 1 − 1.6 × 10⁻⁶ | 1 − 3.7 × 10⁻⁵ | 1 − 2.7 × 10⁻⁴ |
| $Q(-\mu_{gap}{}^2/\sigma_{gap}{}^2)$ | 1 | 1 | 1 | 1 | 1 | 1 |
| $Q(-\mu_{gap}{}^3/\sigma_{gap}{}^3)$ | 1 | 1 | 1 | 1 | 1 | 1 |
| $Q(-\mu_{gap}{}^4/\sigma_{gap}{}^4)$ | 1 | 1 | 1 | 1 | 1 | 1 |
| $Q(-\mu_{gap}{}^5/\sigma_{gap}{}^5)$ | 1 | 1 | 1 | 1 | 1 | 1 |
| $P_{nano}{}^{(i)}$ | 1 | 1 | 1 − 3.4 × 10⁻⁷ | 1 − 3.9 × 10⁻⁵ | 0.9992 | 0.9934 |
| $\tilde{P}_{nano}{}^{(i)}$ | 1 | 1 | 1 | 1 | 0.9990 | 0.9918 |

After the nanowire functioning probabilities $P_{nano}{}^{(i)}$ are obtainted, the overall demux functioning probability $P_{demux}$ can be calculated based on equation (5). Since all the nanowires have the same function probability and the demux contains 252 nanowires, the overall demux functioning probability $P_{demux} = (P_{nano}{}^{(i)})^{252}$ are listed in Table 3.

TABLE 3

Demux Functioning Probability $P_{demux}$

| $\sigma_c$ | 0.06 | 0.08 | 0.10 | 0.12 | 0.14 | 0.16 |
|---|---|---|---|---|---|---|
| $P_{demux}$ | 1 | 1 − 10⁻⁸ | 1 − 8.5 × 10⁻⁵ | 0.9902 | 0.7890 | 0.1885 |

It is evident from these simulation calculations that such nanoscale interface circuits will be subject to process variations that will lead to the variabilities of resistor's and pFET's electrical characteristics. Therefore, the effects of device variability on the yield of resistor/FET-logic demux is further investigated through analysis and computer simulations.

Effect of pFET Threshold Voltage Variability

Similar to the above discussion, the threshold voltages of all the pFETs can be assumed to be independent identical normal random variables denoted as $N(\mu_{th}, \sigma_{th})$. From equation (8) it is clear that the voltage gap $V_{gap}$ of each nanowire is also a normal random variable whose standard deviation $\sigma_{gap}$ is simply equal to $\sigma_{th}$. For each nanowire, the mean of the voltage gap, i.e., $\mu_{gap}$, depends on the Hamming distance between this nanowire and the nanowire being selected, which can be readily calculated based on equation (8). Therefore, given the Hamming distance profile $\{(d_1,n_1),(d_2,n_2),\Lambda,(d_{s_i},n_{s_i})\}$ for each nanowire being selected, $s_i \mu_{gap}$s is obtained, denoted as $\mu_{gap}^1, \mu_{gap}^2, \ldots, \mu_{gap}^{s_i}$. Moreover, the voltage gap of the selected nanowire is also a normal random variable and its mean is denoted as $\mu_{gap}^0$. Hence, equation (6) can be used to calculate the nanowire functioning probability $P_{nano}^{(i)}$ as $$P_{nano}^{(i)} = Q(-\mu_{gap}^0/\sigma_{th}) \prod_{j=1}^{s_i} (Q(-\mu_{gap}^j/\sigma_{th}))^{n_j} \quad (12)$$

After the nanowire functioning probability $P_{nano}^{(i)}$ of all the nanowires is calculated, equation (5) can be used to calculate the overall demux functioning probability.

In the following, the effects of threshold voltage variability with the same example demux are demonstrated. The same values of $V_{sel}$ and $V_0$ are assumed and the mean of threshold voltage $\mu_{th}=0.1$. Recall that, for the constant weight codes (10, 252, 2, 10, 5) being used, all the nanowires have the Hamming distance profile $\{(2, 25), (4, 100), (6, 100), (8, 25), (10, 1)\}$. Accordingly, $\mu_{gap}^0=0.1$, $\mu_{gap}^1=0.1$, $\mu_{gap}^2=0.3$, $\mu_{gap}^3=0.5$, $\mu_{gap}^4=0.7$, and $\mu_{gap}^5=0.9$. Hence, $P_{nano}$ and $P_{demux}=(P_{nano}^{(i)})^{252}$ are calculated as listed in Table 4.

TABLE 4

Nanowire functioning probability $P_{nano}^{(i)}$ and demux functioning probability $P_{demux}$

| $\sigma_{th}$ | 0.009 | 0.012 | 0.015 | 0.018 | 0.021 | 0.024 |
|---|---|---|---|---|---|---|
| $Q(-\mu_{gap}^1/\sigma_{th})$ | 1 | 1 | $1 - 1.3 \times 10^{-11}$ | $1 - 1.1 \times 10^{-8}$ | $1 - 9.5 \times 10^{-7}$ | $1 - 1.6 \times 10^{-5}$ |
| $Q(-\mu_{gap}^2/\sigma_{th})$ | 1 | 1 | $1 - 1.5 \times 10^{-11}$ | $1 - 1.4 \times 10^{-8}$ | $1 - 8.7 \times 10^{-7}$ | $1 - 1.5 \times 10^{-5}$ |
| $Q(-\mu_{gap}^3/\sigma_{th})$ | 1 | 1 | 1 | 1 | 1 | 1 |
| $Q(-\mu_{gap}^4/\sigma_{th})$ | 1 | 1 | 1 | 1 | 1 | 1 |
| $Q(-\mu_{gap}^5/\sigma_{th})$ | 1 | 1 | 1 | 1 | 1 | 1 |
| $P_{nano}^{(i)}$ | 1 | 1 | $1 - 3.9 \times 10^{-10}$ | $1 - 3.7 \times 10^{-7}$ | $1 - 2.3 \times 10^{-5}$ | 0.9996 |
| $P_{demux}$ | 1 | 1 | $1 - 9.7 \times 10^{-8}$ | $1 - 9.2 \times 10^{-5}$ | 0.9943 | 0.9034 |

Compound Effects of Resistor and pFET Variabilities

Figure 8:
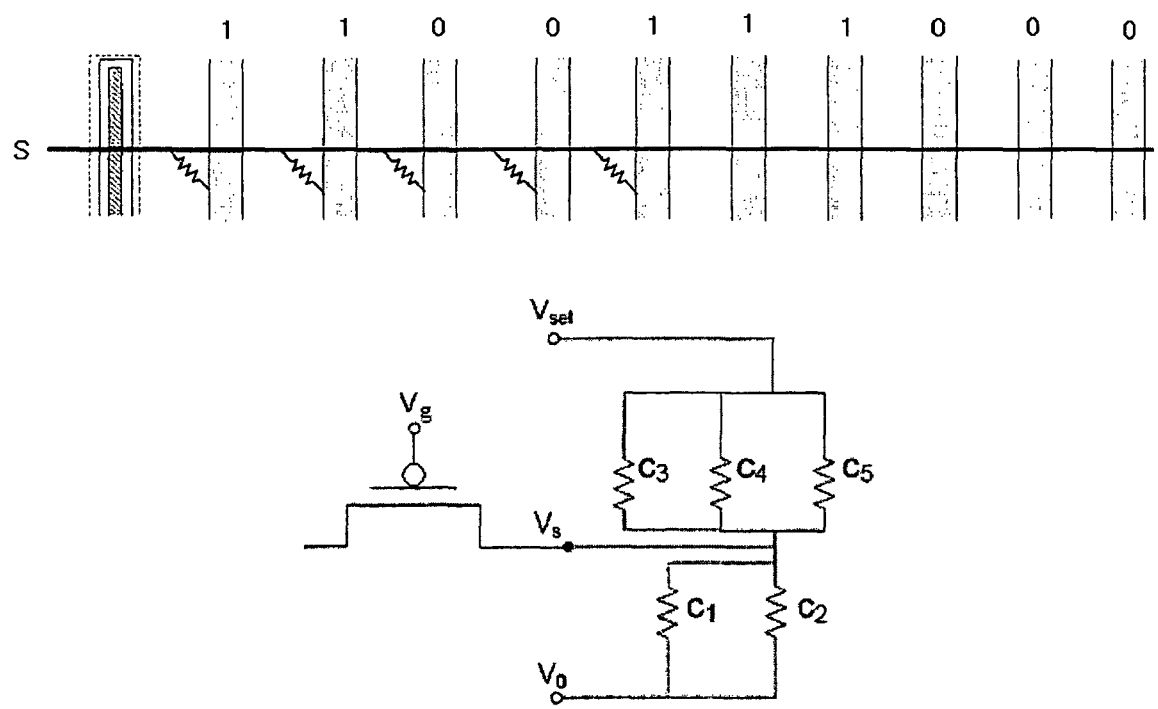
FIG. 8 shows a schematic representation for an equivalent circuit according to an illustrative example for an embodiment of the present invention.
Figure 9A:
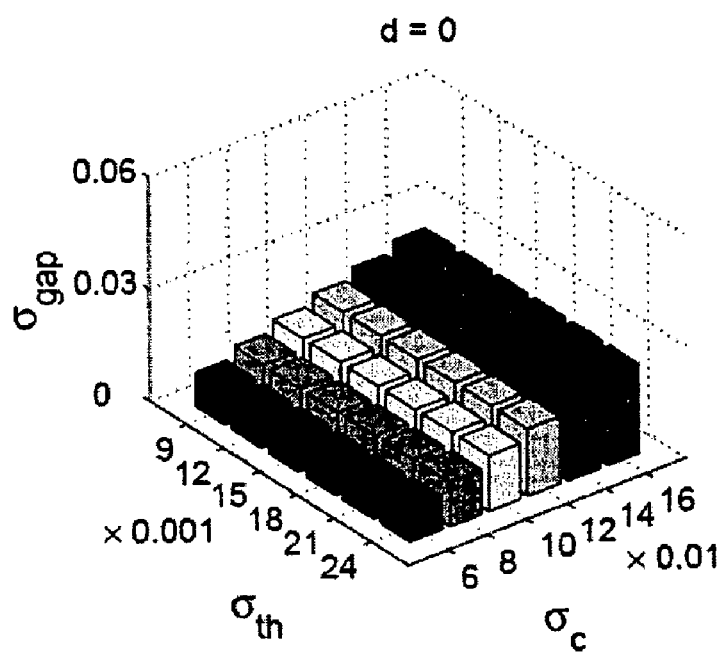
FIGS. 9A-9F show plots of the values of $\sigma_{gap}$ for different Hamming distance d.
Figure 9B:
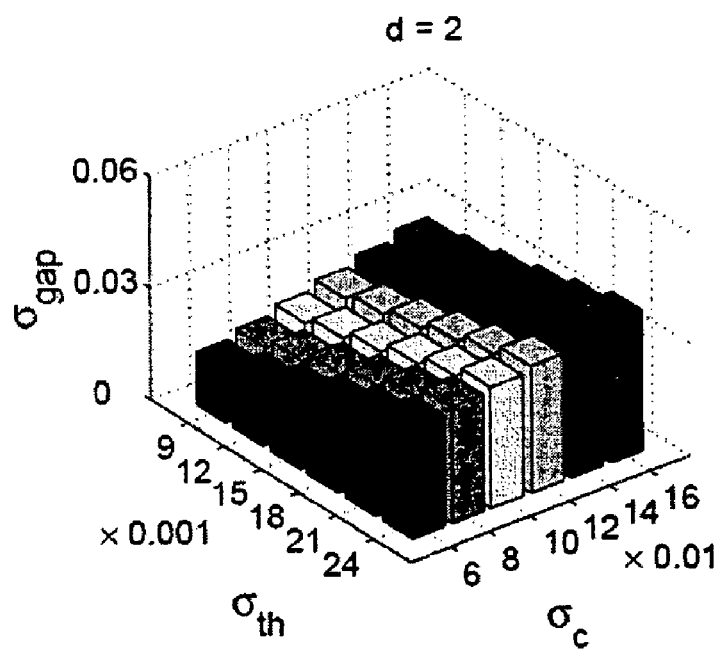
Figure 9C:
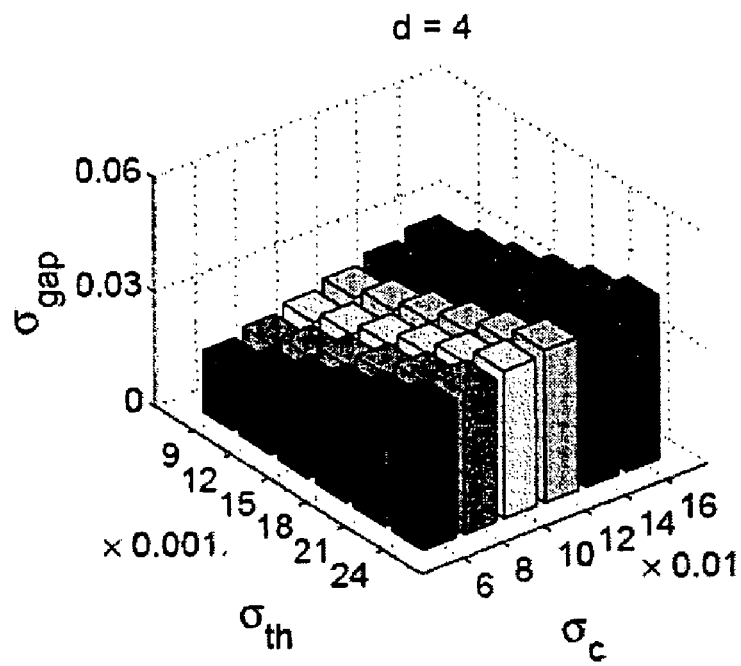
Figure 9D:
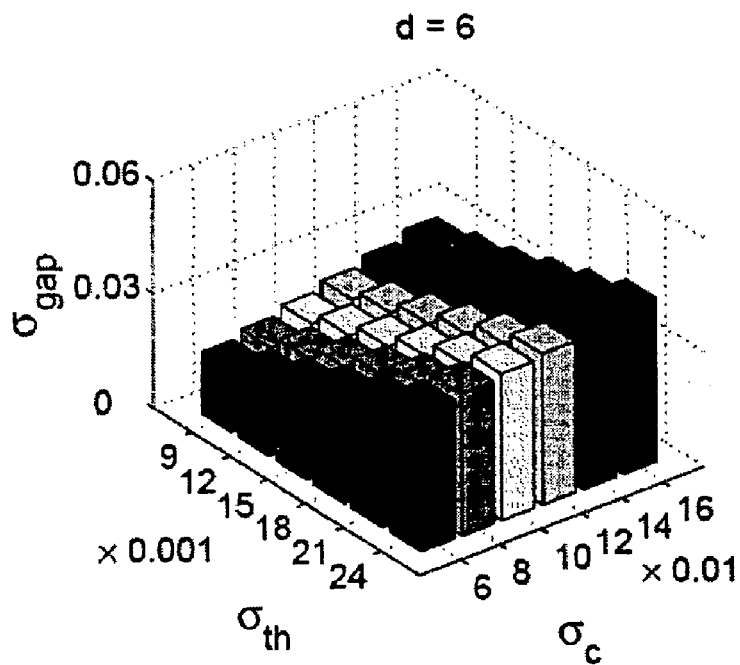
Figure 9E:
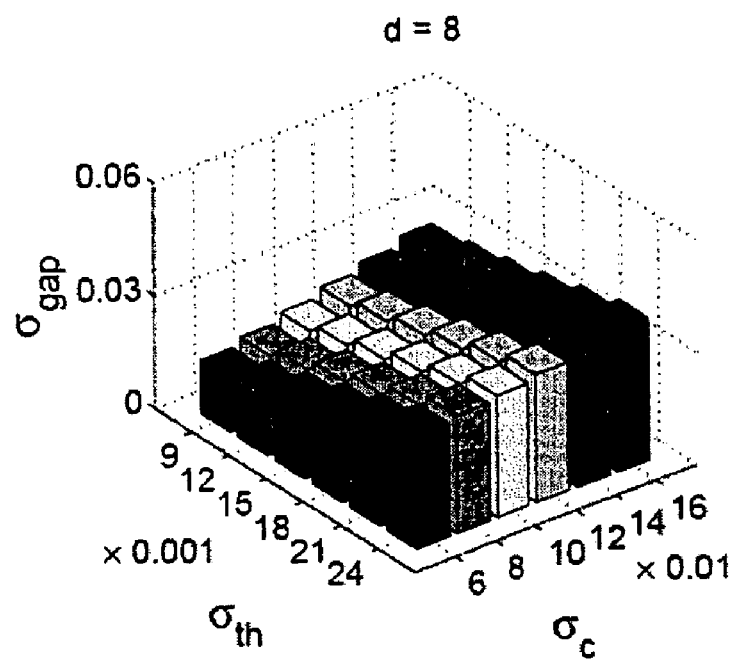
Figure 9F:
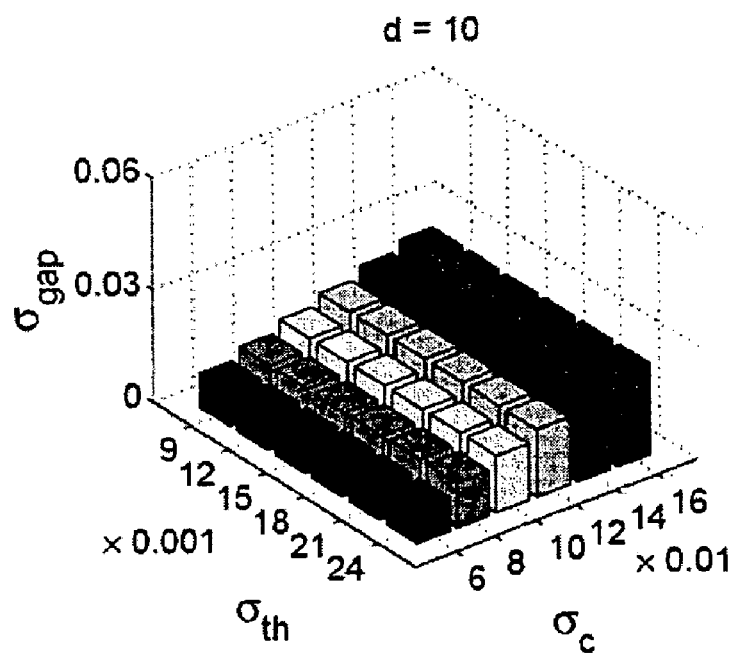

In the above, resistor conductance and pFET threshold voltage were separately considered. This section will address their compound effects on the demux operational reliability. Using the same example as illustrated in FIG. 5, an equivalent circuit of the nanowire is now shown in FIG. 8 to include the pFET with the voltage divider. Again, it is assumed that the resistor conductances are independent identical normal random variables and the pFET threshold voltages are also independent identical normal random variables. Since the voltage gap of each nanowire is obtained by $V_{gap}=V_{gs}-V_{tp}$, where $V_{gs}$ can be approximated as a normal random variable and $V_{tp}$ is a normal random variable, $V_{gap}$ can also be approximated as a normal random variable whose standard deviation is obtained as $$\sigma_{gap} = \infty\sqrt{\sigma_{gs}^2 + \sigma_{th}^2} \quad (13)$$

The mean value of $V_{gap}$, i.e., $\mu_{gap}$, can be readily calculated using equation (8). Once these two normal distribution parameters are obtained, the same procedure as presented above can be followed to calculate the nanowire functioning probability and hence demux functioning probability.

In the following, based on the same demux example used in the above sections, the compound effects of resistor conductance and pFET threshold voltage are demonstrated. The resistor conductance are normal random variables $N(1, \sigma_c)$ truncated into the range $[0, \infty)$, where $\sigma_c$ increases from 0.06 to 0.16 with the step of 0.02. The threshold voltages are normal random variables $N(-0.1, \sigma_{th})$ where $\sigma_{th}$ increases from 0.009 to 0.024 with the step of 0.003. Clearly, for each pair of $\{\sigma_c, \sigma_{th}\}$ and each different value of Hamming distance d, $\sigma_{gap}$ can be directly calculated using the results obtained in the sections for the resistor conductance and the pFET threshold voltage. Table 5 lists the calculated values of $\sigma_{gap}$ and d=6. Meanwhile, for the purpose of further verification, 100000 simulation runs were carried out to estimate the values of $\sigma_{gap}$, denoted as $\tilde{\sigma}_{gap}$, which are also listed in Table 5. FIGS. 9A-9F show the results under different Hamming distance d. Furthermore, it should be noted that the mean value $\mu_{gap}$ remains the same as discussed above, i.e., $\mu_{gap}^0=-0.1$, $\mu_{gap}^1=0.1$, $\mu_{gap}^2=0.3$, $\mu_{gap}^3=0.5$, $\mu_{gap}^4=0.7$, and $\mu_{gap}^5=0.9$.

TABLE 5

The values of $\sigma_{gap}$ and $\tilde{\sigma}_{gap}$ when d = 6

| | | $\sigma_{th} = 0.009$ | $\sigma_{th} = 0.012$ | $\sigma_{th} = 0.015$ | $\sigma_{th} = 0.018$ | $\sigma_{th} = 0.021$ | $\sigma_{th} = 0.024$ |
|---|---|---|---|---|---|---|---|
| $\sigma_c = 0.06$ | $\tilde{\sigma}_{gap}$ | 0.0160 | 0.0178 | 0.0200 | 0.0223 | 0.0248 | 0.0274 |
| | $\sigma_{gap}$ | 0.0159 | 0.0179 | 0.0200 | 0.0223 | 0.0248 | 0.0274 |
| $\sigma_c = 0.08$ | $\tilde{\sigma}_{gap}$ | 0.0198 | 0.0213 | 0.0231 | 0.0252 | 0.0274 | 0.0298 |
| | $\sigma_{gap}$ | 0.0197 | 0.0213 | 0.0232 | 0.0251 | 0.0273 | 0.0298 |
| $\sigma_c = 0.10$ | $\tilde{\sigma}_{gap}$ | 0.0238 | 0.0251 | 0.0266 | 0.0284 | 0.0304 | 0.0326 |
| | $\sigma_{gap}$ | 0.0238 | 0.0251 | 0.0266 | 0.0283 | 0.0304 | 0.0325 |
| $\sigma_c = 0.12$ | $\tilde{\sigma}_{gap}$ | 0.0279 | 0.0290 | 0.0304 | 0.0320 | 0.0337 | 0.0357 |
| | $\sigma_{gap}$ | 0.0279 | 0.0290 | 0.0303 | 0.0320 | 0.0336 | 0.0358 |
| $\sigma_c = 0.14$ | $\tilde{\sigma}_{gap}$ | 0.0321 | 0.0331 | 0.0343 | 0.0357 | 0.0373 | 0.0390 |
| | $\sigma_{gap}$ | 0.0321 | 0.0331 | 0.0344 | 0.0358 | 0.0373 | 0.0390 |
| $\sigma_c = 0.16$ | $\tilde{\sigma}_{gap}$ | 0.0365 | 0.0372 | 0.0383 | 0.0396 | 0.0411 | 0.0428 |
| | $\sigma_{gap}$ | 0.0365 | 0.0372 | 0.0383 | 0.0395 | 0.0410 | 0.0427 |

After the parameters $\sigma_{gap}$ and $\mu_{gap}$ are obtained, the probability of $P_{nano}^{(i)}$ can be calculated using equation (6). Table 6 lists the values of $P_{nano}^{(i)}$.

TABLE 6

Nanowire functioning probability $P_{nano}^{(i)}$

| | $\sigma_{th} = 0.009$ | $\sigma_{th} = 0.012$ | $\sigma_{th} = 0.015$ | $\sigma_{th} = 0.018$ | $\sigma_{th} = 0.021$ | $\sigma_{th} = 0.024$ |
|---|---|---|---|---|---|---|
| $\sigma_c = 0.06$ | $1 - 1.4 \times 10^{-11}$ | $1 - 6.2 \times 10^{-9}$ | $1 - 7.7 \times 10^{-7}$ | 0.99998 | 0.9997 | 0.9982 |
| $\sigma_c = 0.08$ | $1 - 4.0 \times 10^{-8}$ | $1 - 1.1 \times 10^{-6}$ | $1 - 1.9 \times 10^{-5}$ | 0.9998 | 0.9989 | 0.9957 |
| $\sigma_c = 0.10$ | $1 - 8.0 \times 10^{-6}$ | $1 - 4.5 \times 10^{-5}$ | 0.9998 | 0.9989 | 0.9965 | 0.9891 |
| $\sigma_c = 0.12$ | 0.9997 | 0.9994 | 0.9982 | 0.9951 | 0.9894 | 0.9766 |
| $\sigma_c = 0.14$ | 0.9977 | 0.9956 | 0.9912 | 0.9842 | 0.9721 | 0.9508 |
| $\sigma_c = 0.16$ | 0.9885 | 0.9826 | 0.9745 | 0.9584 | 0.9396 | 0.9056 |

Figure 10:
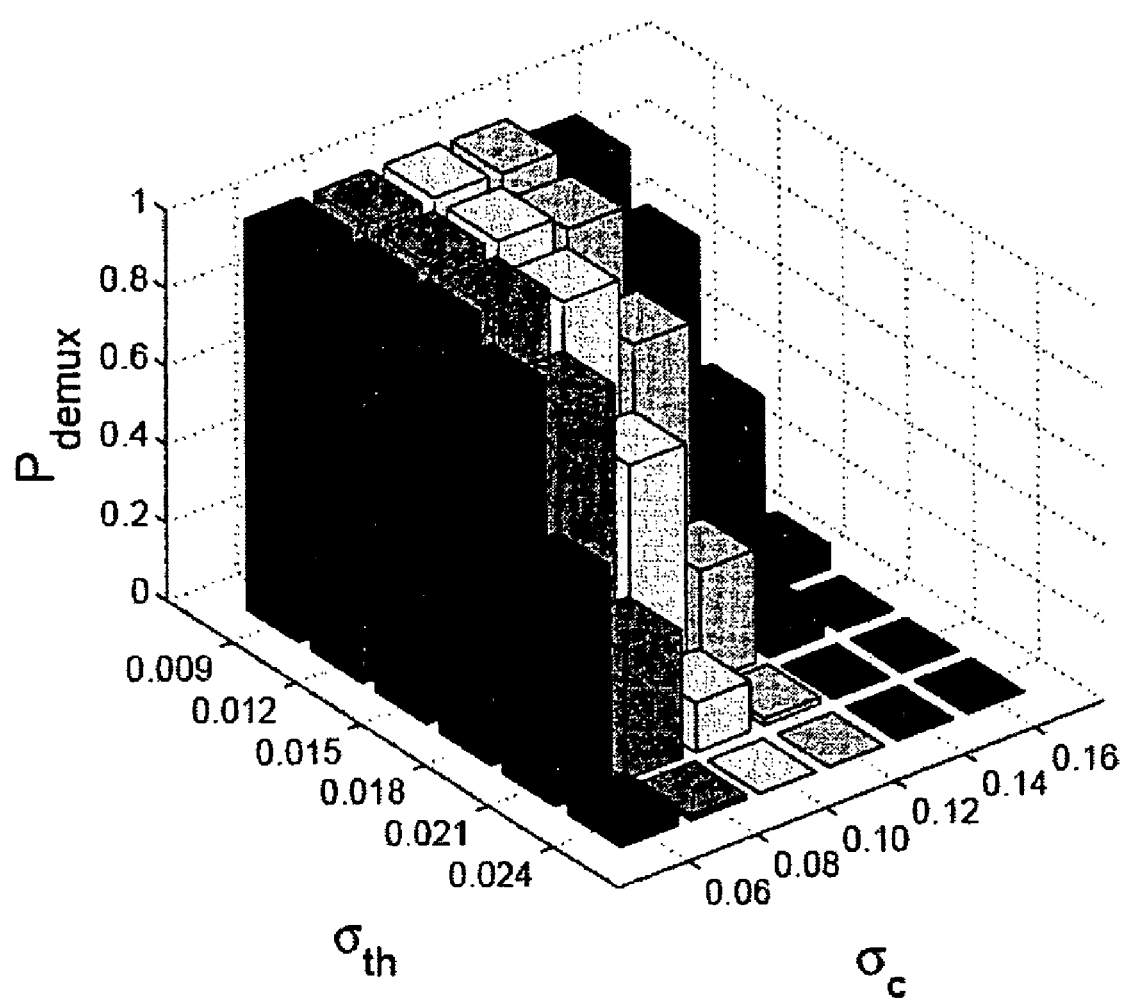
FIG. 10 shows a plot of calculated demux functioning probability as a function of $\sigma_c$ and $\sigma_{th}$.

Finally, the overall demux functioning probability $P_{demux} = (P_{nano}^{(i)})^{252}$ can be calculated and the results are listed in Table 7, which are further illustrated in FIG. 10.

TABLE 7

Demux functioning probability

| | $\sigma_{th} = 0.009$ | $\sigma_{th} = 0.012$ | $\sigma_{th} = 0.015$ | $\sigma_{th} = 0.018$ | $\sigma_{th} = 0.021$ | $\sigma_{th} = 0.024$ |
|---|---|---|---|---|---|---|
| $\sigma_c = 0.06$ | $1 - 3.5 \times 10^{-9}$ | $1 - 1.6 \times 10^{-6}$ | 0.9998 | 0.9938 | 0.9354 | 0.6392 |
| $\sigma_c = 0.08$ | $1 - 1.0 \times 10^{-5}$ | 0.9997 | 0.9953 | 0.9565 | 0.7563 | 0.3373 |
| $\sigma_c = 0.10$ | 0.9980 | 0.9887 | 0.9442 | 0.7667 | 0.4178 | 0.0629 |
| $\sigma_c = 0.12$ | 0.9388 | 0.8509 | 0.6305 | 0.2899 | 0.0675 | 0.0026 |
| $\sigma_c = 0.14$ | 0.5606 | 0.3252 | 0.1262 | 0.0181 | 0.0008 | $3.0 \times 10^{-6}$ |
| $\sigma_c = 0.16$ | 0.0536 | 0.0121 | 0.0015 | $2.2 \times 10^{-5}$ | $1.5 \times 10^{-7}$ | $1.4 \times 10^{-11}$ |

As illustrated by the examples and calculations, the present disclosure provides a demux design solution to tackle the inter-domain interconnect challenge in the emerging hybrid CMOS/nanodevice electronic systems.

According to embodiments of the present invention, a resistor-logic demux is complemented with a single column of pFET switches to provide a hybrid demux structure. Such a hybrid demux structure can well approximate the nonlinear behavior of an ideal demux while maintaining the advantages of resistor-logic demux in terms of the manufacturability and speed.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

All patents, patent applications, provisional applications, and publications referred to or cited herein are incorporated by reference in their entirety, including all figures and tables, to the extent they are not inconsistent wit the explicit teachings of this specification.

It should be understood that the examples and embodiments described herein are for illustrative purposes only and that various modifications or changes in light thereof will be suggested to persons skilled in the art and are to be included within the spirit and purview of this application. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

What is claimed is:

1. A demultiplexer for a hybrid nanodevice/CMOS system comprising a layer of parallel nanowires extending to a nanodevice crossbar and a layer of parallel microwires, where each nanowire of the layer of parallel nanowires is configured to overlap each microwire of the parallel microwires, the demultiplexer comprising:
   a resistor-logic demultiplexer region comprising resistors configured to selectively connect nanowires to microwires; and
   a pFET array for converting an output of the resistor-logic region to a non-linear input to the nanodevice crossbar, the pFET array comprising one pFET along each of the nanowires.

2. The demultiplexer according to claim 1, wherein the microwires comprise $N_{micro}$ number of microwires in the resistor-logic demultiplexer region on which an $N_{micro}$-bit codeword of a binary constant weight code is applied, each microwire of the $N_{micro}$ number of microwires carrying one bit of the $N_{micro}$-bit codeword, wherein a selected nanowire has a voltage of $V_{sel}$ and a minimum voltage difference between the selected nanowire and any other unselected nanowire, denoted as $V_{wire}^m$, equals to $d_{min}/2w(V_{sel}-V_0)$ where w is the weight of codewords of the binary constant weight code, $d_{min}$ is the minimum Hamming distance between any two codewords of the binary constant weight code, and $V_0$ is a voltage represented by a '0' bit of the codeword, wherein the pFETs of the pFET array share a same gate voltage ($V_g$) satisfying the relationship:

$$\begin{cases} V_g - V_{sel} < V_{tp} \\ V_g - (V_{sel} - V_{wire}^m) > V_{tp} \end{cases} \Rightarrow (V_{sel} - V_{wire}^m) < (V_g - V_{tp}) < V_{sel},$$

where $V_{tp}$ is a threshold voltage of the pFETs and $V_{tp}<0$.

3. The demultiplexer according to claim 2, wherein the operational margin is balanced by setting $V_g-V_{tp}$ to $V_{sel}-V_{wire}^m/2$, and $N_{micro}$ is determined by maximization of $d_{min}$.

4. The demultiplexer according to claim 1, wherein a selected nanowire is driven to a desired voltage and non-selected nanowires remain floating.

5. The demultiplexer according to claim 1, wherein the pFET array comprises:
   one of the microwires of the parallel microwires, the one of the microwires being a closest microwire to the nanodevice crossbar; and
   a dielectric layer disposed on the one of the microwires, the dielectric layer arranged between the one of the microwires and an overlapping portion of the nanowires.

6. A demultiplexer for a hybrid nanodevice/CMOS system comprising a nanodevice crossbar, the demultiplexer comprising:
   a set of microwires selectively interconnected to a set of nanowires via resistors, the microwires configured to output a codeword pattern of voltages representing an address according to a constant-weight code, which results in voltage-divided voltages output on the nanowires, wherein a nanowire with an address matching the codeword carries a highest voltage of the voltage-divided voltages output on the nanowires; and
   a single pFET disposed along each of the set of nanowires and configured as a switch between the voltage-divided voltages output on the nanowires and the nanodevice crossbar.

7. The demultiplexer according to claim 6, wherein the single pFET disposed along each of the set of nanowires comprises:
   an additional microwire substantially parallel with the microwires of the set of microwires, wherein each nanowire of the set of nanowires is configured to overlap the additional microwire; and
   a dielectric layer disposed between the additional microwire and the set of nanowires,
   wherein the additional microwire provides a gate electrode for the pFETs.

8. A method for implementing a demultiplexer for a hybrid nanodevice/CMOS system, the method comprising:
   interconnecting $N_{micro}$ microwires to $N_{nano}$ nanowires via resistors in accordance with a characteristic vector representing each nanowire address; and
   determining a gate voltage for a pFET array disposed along the nanowires and configured as a switch between the nanowires and a nanodevice crossbar.

9. The method according to claim 8, wherein determining the gate voltage comprises:
   determining a minimum Hamming distance between any two binary constant weight code codewords representing the nanowire addresses.

10. The method according to claim 8, wherein the $N_{micro}$ microwires are configured to receive an $N_{micro}$-bit codeword of a binary constant weight code, each microwire of the $N_{micro}$ microwires carrying one bit of the $N_{micro}$-bit codeword, wherein a selected nanowire of the $N_{nano}$ nanowires has a voltage of $V_{sel}$ and a minimum voltage difference between the selected nanowire and any other unselected nanowire, denoted as $V_{wire}^{m}$, equals to $$\frac{d_{min}}{2w}(V_{sel} - V_0)$$

where w is the weight of codewords of the binary constant weight code, $d_{min}$ is the minimum Hamming distance between any two codewords of the binary constant weight code, and $V_0$ is a voltage represented by a '0' bit of the codeword, wherein determining the gate voltage comprises satisfying the relationship:

$$\begin{cases} V_g - V_{sel} < V_{tp} \\ V_g - (V_{sel} - V_{wire}^m) > V_{tp} \end{cases} \Rightarrow (V_{sel} - V_{wire}^m) < (V_g - V_{tp}) < V_{sel},$$

where $V_{tp}$ is a threshold voltage of the pFETs of the pFET array and $V_{tp}<0$.

11. The method according to claim 10, wherein determining the gate voltage further comprises: setting $V_g-V_{tp}$ to $V_{sel}-V_{wire}^{m}/2$.

12. The method according to claim 10, wherein $N_{micro}$ is determined by maximization of $d_{min}$.

* * * * *

UNITED STATES PATENT AND TRADEMARK OFFICE
CERTIFICATE OF CORRECTION

PATENT NO. : 7,737,726 B1 Page 1 of 1
APPLICATION NO. : 12/334186
DATED : June 15, 2010
INVENTOR(S) : Tong Zhang et al.

It is certified that error appears in the above-identified patent and that said Letters Patent is hereby corrected as shown below:

Title page,
Abstract, Line 2, "nonoelectronics," should read --nanoelectronics,--.

Column 1,
Line 10, "Mar. 21, 2008," should read --March 12, 2008,--.

Column 7,
Line 56, "an have" should read --can have--.
Line 66, "microwire to" should read --microwires to--.

Column 8,
Line 53, "$P_{mono}^{(i)}$" should read -- $P_{nano}^{(i)}$ --.

Column 12,
Line 30, "$Q(-(\mu_{gap}{}^j / \sigma_{gap}{}^j)$," should read -- $Q(-\mu_{gap}^j / \sigma_{gap}^j)$ --.

Column 14,
Line 16, "$\mu_{th} = 0.1$." should read --$\mu_{th} = -0.1$.--.
Line 19, "$\mu_{gap}^o = 0.1$." should read --$\mu_{gap}^o = -0.1$.--.
Line 57, "$\sigma_{gap} = \infty \sqrt{\sigma_{gs}^2 + \sigma_{th}^2}$," should read -- $\sigma_{gap} = \sqrt{\sigma_{gs}^2 + \sigma_{th}^2}$ --.

Column 17,
Line 62, "equals to $d_{min}/2w(V_{sel}-V_0)$" should read --equals to $\frac{d_{min}}{2w}(V_{sel} - V_0)$ --.

Signed and Sealed this

Twenty-eighth Day of September, 2010

David J. Kappos
*Director of the United States Patent and Trademark Office*